United States Patent
Walter

(10) Patent No.: US 11,144,280 B2
(45) Date of Patent: Oct. 12, 2021

(54) METHOD AND APPARATUS FOR PROCESSING DATA

(71) Applicant: Siemens Aktiengesellschaft, Munich (DE)

(72) Inventor: Maximillian Walter, Nuremberg (DE)

(73) Assignee: Siemens Aktiengesellschaft, Munich (DE)

(*) Notice: Subject to any disclaimer, the term of this patent is extended or adjusted under 35 U.S.C. 154(b) by 68 days.

(21) Appl. No.: 16/657,341

(22) Filed: Oct. 18, 2019

(65) Prior Publication Data

US 2020/0125324 A1 Apr. 23, 2020

(30) Foreign Application Priority Data

Oct. 19, 2018 (EP) .................................. 18201484

(51) Int. Cl.
*G06F 5/00* (2006.01)
*G06F 7/50* (2006.01)

(52) U.S. Cl.
CPC . *G06F 5/00* (2013.01); *G06F 7/50* (2013.01)

(58) Field of Classification Search
CPC .................................................... H03M 13/07
See application file for complete search history.

(56) References Cited

U.S. PATENT DOCUMENTS

| 5,546,080 A * | 8/1996 | Langdon, Jr. ........... G06T 9/005 |
| | | 341/107 |
| 6,633,677 B1 * | 10/2003 | Dube ....................... G06T 9/004 |
| | | 382/236 |
| 2006/0106905 A1 | 5/2006 | Chren, Jr. |
| 2013/0262938 A1 * | 10/2013 | Schmitt .................. H03M 13/47 |
| | | 714/48 |
| 2016/0365871 A1 | 12/2016 | Richter et al. |

FOREIGN PATENT DOCUMENTS

EP           3104276           12/2016

OTHER PUBLICATIONS

Schiffel Ute : "Hardware Error Detection Using AN-Codes", internet article, XP002790843, found in Internet: URL:https://d-nb.info/1067189289/34[ found Apr. 25, 2019]; pp. 26-35; 2011.
EP Search Report based on EP18201484 filed Oct. 19, 2018 dated May 28, 2019.

* cited by examiner

*Primary Examiner* — Chuong D Ngo
(74) *Attorney, Agent, or Firm* — Cozen O'Connor

(57) ABSTRACT

A computer program product, an apparatus, a functionally safe programmable controller and a method for processing data, wherein an uncoded real number x is converted into a logarithmic number system (LNS) coded integer $x_{LNS}$ via a predetermined conversion rule for a logarithmic number system (LNS) in accordance with the relationship: $x_{LNS}$=sgn(x)·$2^m$+ld|x|·$2^n$, where sgn(x) denotes a sign function of the uncoded real number x, ld|x| denotes a binary logarithm of the uncoded real number x, m denotes a first exponent and n denotes a second exponent, and the LNS-coded integer $x_{LNS}$ is coded into an arithmetically coded integer $x_c$ via arithmetic coding such that the required integer operations is reduced.

17 Claims, 3 Drawing Sheets

METHOD AND APPARATUS FOR PROCESSING DATA

BACKGROUND OF THE INVENTION

1. Field of the Invention

The present invention relates to a method, a computer program product for processing data, an apparatus for processing data, a functionally safe programmable controller having such an apparatus, and to the processing of data, in particular the combination of uncoded and coded processing of data.

2. Description of the Related Art

Functionally safe systems are used to reduce risks to health and life and to avoid environmental damage. In addition to safely capturing and communicating process information, these systems require safe processing, such as in programmable logic controllers or in an industrial PC.

In functionally safe systems, errors are intended to be detected with a high degree of probability when storing, transmitting and processing data. This is also intended to be possible if the functionally safe system processes not only integers but also real numbers.

Real numbers can be approximated via of integers. Here, it is known to represent real numbers via fixed point arithmetic, floating point arithmetic and fractions.

Of these representation possibilities, floating point arithmetic is the most suitable because overflows virtually cannot occur and rounding errors are easier to manage than the other representation possibilities.

Floating point arithmetic is used, in combination with ANBD coding during use in functionally safe systems, to process the data in a coded form so that the data can be protected from errors and an undetected change.

ANBD coding is arithmetic coding in which a floating point number or floating point arithmetic operations, for example, is/are converted into an arithmetically coded number using a rule. EP 3 104 276 A1 discloses ANBD coding.

However, this conversion via the rule comprises converting the incoming floating point arithmetic operations into integer operations with the aid of software. This is due to the fact that ANBD coding can be used only for integer operations but not for floating point arithmetic operations because the processors used (i.e., floating point units (FPUs)) do not support coded processing via floating point arithmetic.

This has the disadvantage that a high performance overhead is produced when processing coded floating point numbers because a multiplicity of integer operations must be performed for one floating point arithmetic operation.

SUMMARY OF THE INVENTION

Accordingly, it is therefore an object of the present invention to provide a method for improving the processing of data.

This and other objects and advantages are achieved in accordance with the invention by a method for processing data, where an uncoded real number x is converted into an Logarithmic Number System (LNS) coded integer $x_{LNS}$ via a predetermined conversion rule for a logarithmic number system (LNS) in accordance with the relationship:

$$x_{LNS} = \text{sgn}(x) \cdot 2^m + \mathit{ld}|x| \cdot 2^n, \quad \text{Eq. 1}$$

where sgn(x) denotes a sign function of the uncoded real number x, ld|x| denotes a binary logarithm of the uncoded real number x, m denotes a first exponent and n denotes a second exponent, and the LNS-coded integer $x_{LNS}$ is coded into an arithmetically coded integer $x_c$ by means of arithmetic coding.

The step of converting the uncoded real number x into an LNS-coded integer $x_{LNS}$ via the conversion rule can also be referred to as LNS coding.

The LNS coding in conjunction with the arithmetic coding results in a considerable reduction in the required integer operations in comparison with the use of the combination of floating point arithmetic operations and arithmetic coding.

The reason is that, if LNS coding and arithmetic coding are combined, a real number can be stored and processed as an integer. In detail, an LNS-coded integer $x_{LNS}$ or an integer operation is needed to convert a real number.

As a result, the combination of LNS coding and arithmetic coding has the technical effect that the performance overhead is considerably reduced as a result of the reduction in the required integer operations in comparison with the combination of floating point arithmetic operations and arithmetic coding, as known from the prior art, because fewer integer operations are needed to convert and code an uncoded real number into an arithmetically coded integer. In particular, fewer integer operations are needed to process arithmetically coded LNS numbers than to process arithmetically coded floating point numbers.

This makes it possible to achieve improved performance in comparison with the combination of floating point arithmetic operations and arithmetic coding with simultaneously reduced required computing power. Hardware with reduced computing power can be used. Consequently, the hardware costs can be reduced.

LNS is the English term for "Logarithmic Number System" which is used to represent real numbers. With regard to LNS, reference is made to the publications: Siti Zarina Md Naziri, Rizalafande Che Ismail, Ali Yeon Md Shakaff: Implementation of LNS Addition and Subtraction Function with Co-transformation in Positive and Negative Region: A Comparative Analysis, In: 3rd International Conference on Electronic Design (ICED), 2016; J. Nicholas Coleman, Chris I. Softley, Jiri Kadlec, Rudolf Matousek, Milan Tichy, Zdenek Pohl, Antonin Hermanek, Nico F. Benschop: The European Logarithmic Microprocessor, In: IEEE TRANSACTIONS ON COMPUTERS, VOL. 57, NO. 4, APRIL 2008; William A. Chren JR.: Method for reducing memory size in logarithmic number system arithmetic units, US 2006/0106905 A1, May 18, 2006; Michael Haselman: A Comparison of Floating Point and Logarithmic Number Systems on FPGAs, Master Thesis, University of Washington 2005; J. N. Coleman, E. I. Chester, C. I. Softley, and J. Kadlec: Arithmetic on the European Logarithmic Microprocessor, In: IEEE TRANSACTIONS ON COMPUTERS, VOL. 49, NO. 7, JULY 2000; J. N. Coleman and E. I. Chester: A 32-Bit Logarithmic Arithmetic Unit and Its Performance Compared to Floating-Point, In: Proceedings 14th IEEE Symposium on Computer Arithmetic, 1999; and J. N. Coleman: Simplification of table structure in logarithmic arithmetic, In: IEEE Electronics Letters (Volume: 31, Issue: 22, 1995).

x is an uncoded real number. x therefore comprises the number range of the real numbers, i.e., rational and irrational numbers, for example.

$x_{LNS}$ is a preferably LNS-coded real number, stored as an integer. An integer is equal to the term "whole number" and is a subset of the real numbers. $x_{LNS}$ is rounded, for example.

x is converted into an LNS-coded integer $x_{LNS}$ with the aid of the LNS coding using equation (1), as set forth above.

The exponents m and n in equation (1) are used to set the range of values and are therefore also used to determine the word width (for example, 32 or 64 bits) of the integer to be processed. m and n can be represented as an integer.

$x_c$ is an arithmetically coded integer. An LNS-coded integer $x_{LNS}$ is coded into an arithmetically coded integer $x_c$ via arithmetic coding. The arithmetic coding is used to expand the LNS-coded integer $x_{LNS}$ with different check bits in order to be able to detect particular errors that occur.

For example, errors in the range of values, operand and operator errors or variables that are not updated and are used can be detected, inter alia, with the arithmetic coding.

In accordance with one embodiment, the real number x is received as an integer from a sensor or as a floating point number from the sensor or as a floating point number or as a string as a result of an input by a user or as a constant of a program code.

The real number x can be received as an integer from a sensor. An analog value received from a sensor is digitized via an A/D converter and can then be provided, for example, as an integer or as a floating point number, for further processing. The real number x can also be received as a floating point number or as a fraction. In addition, the real number x can be received as a string via an input by a user or as a constant of a program code.

In accordance with another embodiment, the uncoded real number x is converted into the LNS-coded integer $x_{LNS}$ during a compiling process.

In accordance with yet another embodiment, the LNS-coded integer $x_{LNS}$ is coded to form the arithmetically coded integer $x_c$ during a compiling process.

In accordance with another embodiment, a number N, where N≥1, of uncoded real numbers x, y is converted into a corresponding number N of LNS-coded integers $x_{LNS}$, $y_{LNS}$ via the predetermined conversion rule, the number N of LNS-coded integers $x_{LNS}$, $y_{LNS}$ is coded into the corresponding number N of arithmetically coded integers $x_c$, $y_c$ via the arithmetic coding, and at least one coded operation is applied to the number N of arithmetically coded integers $x_c$, $y_c$. This results in further coded integers, in particular.

Coded operations comprise arithmetically coded operations, for example. An arithmetic operation is, for example, an ADD, SUB, MUL or MOV operation. An arithmetically coded operation is, for example, CADD, CSUB, CMUL or CMOV, in which case the C in the CADD operation and in the other arithmetically coded operations indicates that an arithmetically coded operation is involved.

In accordance with another embodiment, ANBD coding is used as the arithmetic coding and codes the LNS-coded integer $x_{LNS}$ into the arithmetically coded integer $x_c$ via an input constant A, a variable-specific signature $B_x$ and a cycle-specific signature D in accordance with the relationship:

$$x_c = A \cdot x_{LNS} + B_x + D. \quad \text{Eq. 2}$$

The ANBD coding has a B signature and a D signature and an input constant A.

The input constant A is, in particular, an odd number, preferably a prime number. The use of the input constant A makes it possible to prevent corruption of operands, such as bit flips.

D is a cycle-specific signature D. Here, cycle-specific means that the D signature is the same for all operands in one cycle, but may change for a next or further cycle. Here, a cycle corresponds, in particular, to a loop run. In other words, this means that the value of D is the same for all operands within one cycle, but may change for a further cycle.

The use of the cycle-specific signature D makes it possible to detect when variables that have not been updated or are out of date are used during the further processing of data.

$B_x$ is a variable-specific signature. Here, variable-specific means that, for each variable, such as x, y, z, the associated B signature, i.e., $B_x$, $B_y$ or $B_z$, has a specific value that is dependent on the respective variable. $B_x$ is additionally preferably static, which means that the value of $B_x$ or of $B_y$ or of $B_z$ is the same for each cycle. Furthermore, the value of $B_x$ is different for two operands with a high degree of probability.

The use of the variable-specific signature $B_x$ makes it possible to detect and prevent operand and operator errors. Examples of operand errors are a transposition of operands or use of an incorrect operand (for example, the reading of an incorrect address). An example of an operator error is execution of an incorrect operation (for example, AND instead of ADD).

In accordance with another embodiment, the coded operation comprises a coded addition operation CADD in which the arithmetically coded integer $x_c$, the arithmetically coded integer $y_c$ and a first parameter $K_1$ are added using the cycle-specific signature D in order to calculate a result of an addition $(x+y)_c$ of the arithmetically coded integers $x_c$, $y_c$ in accordance with the relationship:

$$(x+y)_c = x_c + y_c + K_1 - D, \quad \text{Eq. 3}$$

where the first parameter $K_1$ is calculated via a signature $B_x$ specific to the arithmetically coded integer $x_c$, a signature $B_y$ specific to the arithmetically coded integer $y_c$ and a signature $B_z$ specific to an arithmetically coded integer $z_c$ in accordance with the relationship:

$$K_1 = B_{x+y} - B_x - B_z. \quad \text{Eq. 4}$$

In accordance with another embodiment, DNB coding is used as the arithmetic coding and codes the LNS-coded integer $x_{LNS}$ into the arithmetically coded integer $x_c$ via a cycle-specific signature D and a variable-specific signature $B_x$ in accordance with the relationship:

$$x_c = D \cdot x_{LNS} + B_x. \quad \text{Eq. 5}$$

In accordance with another embodiment, the coded operation comprises a coded addition operation CADD in which the arithmetically coded integer $x_c$ and the arithmetically coded integer $y_c$ are added using a second parameter $K_2$ to form an arithmetically coded integer $z_c$ in accordance with the relationship:

$$z_c = (x_c + y_c + K_2), \quad \text{Eq. 6}$$

where the second parameter $K_2$ is calculated via a signature $B_x$ specific to the arithmetically coded integer $x_c$, a signature $B_y$ specific to the arithmetically coded integer $y_c$ and a signature $B_z$ specific to the arithmetically coded integer in accordance with the relationship:

$$K_2 = B_z - B_x - B_y. \quad \text{Eq. 7}$$

In accordance yet another embodiment, the coded operation comprises a coded subtraction operation CSUB in which a difference between the arithmetically coded integer $x_c$ and the arithmetically coded integer $y_c$ is calculated using a third parameter $K_3$ in order to provide an arithmetically coded integer $z_c$ in accordance with the relationship:

$$z_c = (x_c - y_c + K_3), \quad \text{Eq. 8}$$

where the third parameter $K_3$ is calculated via a signature $B_x$ specific to the arithmetically coded integer $x_c$, a signature $B_y$ specific to the arithmetically coded integer $y_c$ and a signature $B_z$ specific to the arithmetically coded integer in accordance with the relationship:

$$K_3 = B_z - B_x + B_y.\qquad\text{Eq. 9}$$

With respect to the definition of the DNB coding and its coded operations as well as further examples of coded arithmetic operations, reference is made to DE 10 2018 189988.1, the content of which is incorporated herein by reference in its entirety.

It is also an object of the invention to provide a non-transitory computer readable medium (i.e., a computer program product) which, on a program-controlled device, causes the above-described method to be carried out in accordance with the disclosed embodiments.

A computer program product, for example a computer program means, can be provided or delivered, for example, as a storage medium, for example a memory card, a USB stick, a CD-ROM, a DVD, a Blu-ray disc, or else in the form of a downloadable file from a server in a network. This can be effected, for example, in a wireless communication network, by transmitting a corresponding file containing the computer program product or the computer program means.

It is also an object of the invention to provide an apparatus for processing data. The apparatus comprises a conversion unit that is configured to convert an uncoded real number x into an LNS-coded integer $x_{LNS}$ via a predetermined conversion rule for a logarithmic number system, LNS, in accordance with the relationship:

$$x_{LNS} = \text{sgn}(x)\cdot 2^m + Id|x|\cdot 2^n,\qquad\text{Eq. 10}$$

where sgn(x) denotes a sign function of the uncoded real number x, Id|x| denotes a binary logarithm of the uncoded real number x, m denotes a first exponent and n denotes a second exponent. The apparatus also comprises a coding unit that is configured to code the LNS-coded integer $x_{LNS}$ into an arithmetically coded integer $x_c$ via arithmetic coding.

The respective unit, for example the coding unit, can be implemented using hardware and/or software. In the case of a hardware implementation, the respective unit may be in the form of an apparatus or part of an apparatus, such as in the form of a computer or a microprocessor or a control computer of a vehicle. In the case of a software implementation, the respective unit may be in the form of a computer program product, a function, a routine, part of a program code or an executable object.

The embodiments and features described for the disclosed embodiments of the method accordingly apply to the apparatus in accordance with the invention.

It is also an object of the invention to provide a functionally safe programmable controller having an apparatus in accordance with the invention.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The subclaims and the exemplary embodiments of the invention which are described below relate to further advantageous configurations and aspects of the invention. The invention is explained in more detail below on the basis of preferred embodiments with reference to the enclosed figures, in which:

DETAILED DESCRIPTION OF THE EXEMPLARY EMBODIMENTS

In the figures, identical or functionally identical elements have been provided with the same reference signs, unless indicated otherwise.

Figure 1:
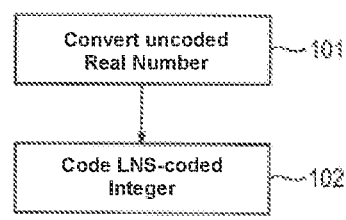
FIG. 1 shows a schematic flowchart of an exemplary embodiment of a method for processing data in accordance with the invention.

FIG. 1 shows a schematic flowchart of an exemplary embodiment of a method for processing data in accordance with the invention.

With reference to FIG. 1, an uncoded real number x is converted into an LNS-coded integer $x_{LNS}$, as indicated in step 101.

In detail, in step 101, the uncoded real number x is converted into the LNS-coded integer $x_{LNS}$ via a predetermined conversion rule for a logarithmic number system, LNS, in accordance with the relationship:

$$x_{LNS} = \text{sgn}(x)\cdot 2^m + Id|x|\cdot 2^n,\qquad\text{Eq. 1}$$

where sgn(x) denotes a sign function of the uncoded real number x, Id|x| denotes a binary logarithm of the uncoded real number x, m denotes a first exponent and n denotes a second exponent.

The real number x can be received as an integer from a sensor or as a floating point number from the sensor or as a floating point number or as a string as a result of an input by a user or as a constant of a program code.

The uncoded real number x is preferably converted into the LNS-coded integer $x_{LNS}$ during a compiling process.

In step 102, the LNS-coded integer $x_{LNS}$ is coded into an arithmetically coded integer $x_c$ via arithmetic coding.

The LNS-coded integer $x_{LNS}$ is preferably coded to form the arithmetically coded integer $x_c$ during a compiling process.

Figure 2:
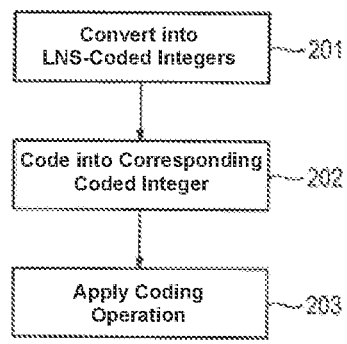
FIG. 2 shows a schematic flowchart of a further exemplary embodiment of a method for processing data via coded operations in accordance with the invention.

FIG. 2 shows a schematic flowchart of a further exemplary embodiment of a method for processing data via coded operations.

With reference to FIG. 2, a number N of uncoded real numbers x, y is converted into a number N of LNS-coded integers $x_{LNS}$, $y_{LNS}$ via a conversion rule, as indicated in step 201.

Furthermore, in step 202, the number N of LNS-coded integers $x_{LNS}$, $y_{LNS}$ is coded into the corresponding number N of arithmetically coded integers $x_c$, $y_c$ via the arithmetic coding.

In this case, the arithmetic coding comprises, in particular, ANBD coding in which the LNS-coded integer $x_{LNS}$ is coded into the arithmetically coded integer $x_c$ in accordance with the relationship:

$$x_c = A \cdot x_{LNS} + B_x + D. \quad \text{Eq. 2}$$

In step 203, a coded operation is applied to the number N of arithmetically coded integers $x_c$, $y_c$.

In this case, the coded operation comprises, in particular, a coded addition operation CADD.

Figure 3:
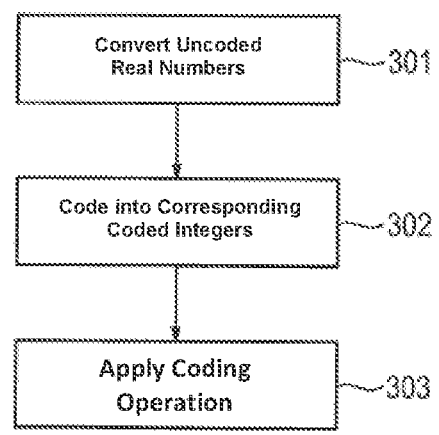
FIG. 3 shows a schematic flowchart of a further exemplary embodiment of a method for processing data via coded operations in accordance with the invention.

FIG. 3 shows a schematic flowchart of a further exemplary embodiment of a method for processing data via coded operations.

With reference to FIG. 3, a number N of uncoded real numbers x, y is converted into a number N of LNS-coded integers $x_{LNS}$, $y_{LNS}$ by means of a conversion rule, as indicated in step 301.

Furthermore, in step 302, the number N of LNS-coded integers $x_{LNS}$, $y_{LNS}$ is coded into the corresponding number N of arithmetically coded integers $x_c$, $y_c$ via the arithmetic coding.

Here, the arithmetic coding comprises, in particular, DNB coding that codes the LNS-coded integer $x_{LNS}$ into the arithmetically coded integer $x_c$ in accordance with the relationship:

$$x_c = D \cdot x_{LNS} + B_x \quad \text{Eq. 5.}$$

In step 303, a coded operation is applied to the number N of arithmetically coded integers $x_c$, $y_c$. Here, the coded operation comprises, in particular, a coded addition operation CADD and/or a subtraction operation CSUB.

Figure 4:
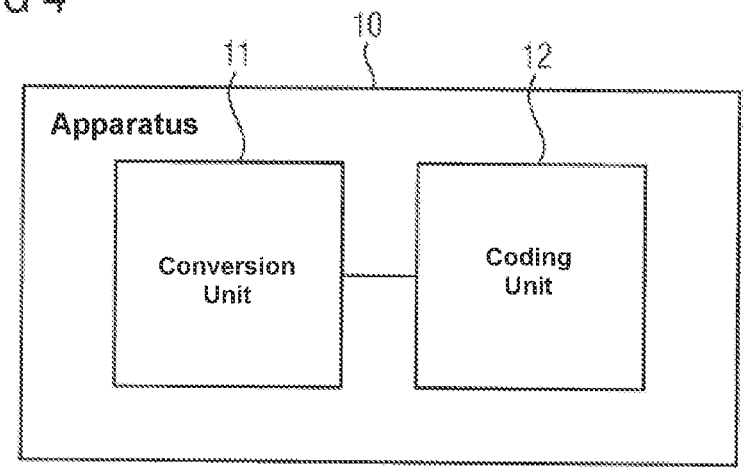
FIG. 4 shows a schematic block diagram of an exemplary embodiment of an apparatus for processing data in accordance with the invention.

FIG. 4 shows a schematic block diagram of an exemplary embodiment of an apparatus 10 for processing data. The apparatus 10 comprises a conversion unit 11 and a coding unit 12.

The conversion unit 11 is configured to convert an uncoded real number x into an LNS-coded integer $x_{LNS}$ via a predetermined conversion rule for a logarithmic number system, LNS, in accordance with the relationship:

$$x_{LNS} = \text{sgn}(x) \cdot 2^m + ld|x| \cdot 2^n \quad \text{Eq. 1.}$$

In particular, the conversion unit 11 configured to perform method steps 101, 201 and 301 in accordance with FIGS. 1, 2 and 3 and, in particular, to also convert further uncoded real numbers.

The coding unit 12 is configured to code the LNS-coded integer $x_{LNS}$ into an arithmetically coded integer $x_c$ via arithmetic coding.

In particular, the coding unit 12 is configured to perform method steps 102, 202 and 302 in accordance with FIGS. 1, 2 and 3 and, in particular, to also code further LNS-coded integers.

Figure 5:
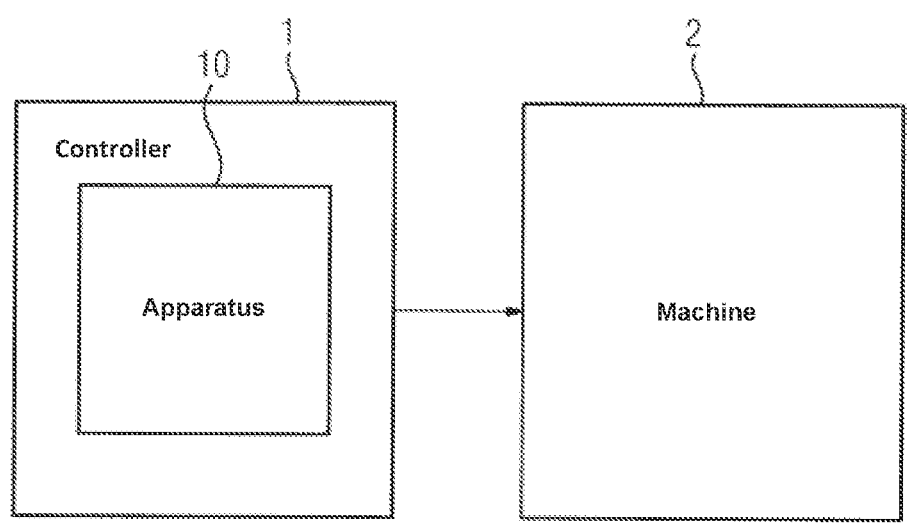
FIG. 5 shows a schematic block diagram of an exemplary embodiment of a functionally safe programmable controller having the apparatus according to FIG. 4.

FIG. 5 shows a schematic block diagram of an exemplary embodiment of a functionally safe programmable controller 1.

The controller 1 is configured to control a machine 2, such as a conveyor belt or a robot arm. For this purpose, the controller 1 in FIG. 5 has an apparatus 10 for processing data, as described with respect to FIG. 4.

Even though the present invention has been described on the basis of exemplary embodiments, it can be modified in various ways.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for processing data to provide a functionally safe programmable controller, the method comprising:
   converting an uncoded real number x within a programmable controller into a logarithmic number system (LNS) coded integer $x_{LNS}$ via a predetermined conversion rule for the logarithmic number system (LNS) in accordance with the relationship:

$$x_{LNS} = \text{sgn}(x) \cdot 2^m + ld|x| \cdot 2^n,$$

where sgn(x) denotes a sign function of the uncoded real number x, ld|x| denotes a binary logarithm of the uncoded real number x, m denotes a first exponent and n denotes a second exponent;
   coding the LNS-coded integer $x_{LNS}$ within the programmable controller into an arithmetically coded integer $x_c$ via arithmetic coding to provide the functionally safe programmable controller; and
   controlling a machine within an industrial system via the functionally safe programmable controller.

2. The method as claimed in claim 1, wherein the real number x is received as one of (i) an integer from a sensor (ii) a floating point number from the sensor (iii) a floating point number (iv) a string as a result of an input by a user and (v) a constant of a program code.

3. The method as claimed in claim 1, wherein the uncoded real number x is converted into the LNS-coded integer $x_{LNS}$ during a compiling process.

4. The method as claimed in claim 2, wherein the uncoded real number x is converted into the LNS-coded integer $x_{LNS}$ during a compiling process.

5. The method as claimed in claim 1, wherein the LNS-coded integer $x_{LNS}$ is coded to form the arithmetically coded integer $x_c$ during a compiling process.

6. The method as claimed in claim 1, further comprising:
   converting a number N, where N≥1, of uncoded real numbers x, y into a corresponding number N of LNS-coded integers $x_{LNS}$, $y_{LNS}$ via the predetermined conversion rule;
   coding the number N of LNS-coded integers $x_{LNS}$, $y_{LNS}$ into the corresponding number N of arithmetically coded integers $x_c$, $y_c$ via the arithmetic coding; and
   applying a coded operation to the number N of arithmetically coded integers $x_c$, $y_c$.

7. The method as claimed in claim 6, wherein ANBD coding is utilized as the arithmetic coding and codes the LNS-coded integer $x_{LNS}$ into the arithmetically coded integer $x_c$ via an input constant A, a variable-specific signature $B_x$ and a cycle-specific signature D in accordance with the relationship:

$$x_c = A \cdot x_{LNS} + B_x + D.$$

8. The method as claimed in claim 7, wherein the coded operation comprises a coded addition operation (CADD) in which the arithmetically coded integer $x_c$, the arithmetically coded integer $y_c$ and a first parameter $K_1$ are added utilizing the cycle-specific signature D to calculate a result of an addition $(x+y)_c$ of the arithmetically coded integers $x_c$, $y_c$ in accordance with the relationship:

$$(x+y)_c = x_c + y_c + K_1 - D,$$

where the first parameter $K_1$ is calculated via a signature $B_x$ specific to the arithmetically coded integer $x_c$, a signature $B_y$ specific to the arithmetically coded integer $y_c$ and a signature $B_z$ specific to an arithmetically coded integer $z_c$ in accordance with the relationship:

$$K_1 = B_{x+y} - B_x - B_z.$$

9. The method as claimed in claim 6, wherein the coded operation comprises a coded addition operation (CADD) in which the arithmetically coded integer $x_c$, the arithmetically coded integer $y_c$ and a first parameter $K_1$ are added utilizing the cycle-specific signature D to calculate a result of an addition $(x+y)_c$ of the arithmetically coded integers $x_c$, $y_c$ in accordance with the relationship:

$$(x+y)_c = x_c + y_c + K_1 - D,$$

where the first parameter $K_1$ is calculated via a signature $B_x$ specific to the arithmetically coded integer $x_c$, a signature $B_y$ specific to the arithmetically coded integer $y_c$ and a signature $B_z$ specific to an arithmetically coded integer $z_c$ in accordance with the relationship:

$$K_1 = B_{x+y} - B_x - B_z.$$

10. The method as claimed in claim 6, wherein DNB coding is utilized as the arithmetic coding and codes the LNS-coded integer $x_{LNS}$ into the arithmetically coded integer $x_c$ via a cycle-specific signature D and a variable-specific signature $B_x$ in accordance with the relationship:

$$x_c = D \cdot x_{LNS} + B_x.$$

11. The method as claimed in claim 10, wherein the coded operation comprises a coded addition operation (CADD) in which the arithmetically coded integer $x_c$ and the arithmetically coded integer $y_c$ are added utilizing a second parameter $K_2$ to form an arithmetically coded integer $z_c$ in accordance with the relationship:

$$z_c = (x_c + y_c + K_2),$$

where the second parameter $K_2$ is calculated via a signature $B_x$ specific to the arithmetically coded integer $x_c$, a signature $B_y$ specific to the arithmetically coded integer $y_c$ and a signature $B_z$ specific to the arithmetically coded integer in accordance with the relationship:

$$K_2 = B_z - B_x - B_y.$$

12. The method as claimed in claim 10, wherein the coded operation comprises a coded subtraction operation (CSUB) in which a difference between the arithmetically coded integer $x_c$ and the arithmetically coded integer $y_c$ is calculated utilizing a third parameter $K_3$ in order to provide an arithmetically coded integer $z_c$ in accordance with the relationship:

$$z_c = (x_c - y_c + K_3),$$

where the third parameter $K_3$ is calculated via a signature $B_x$ specific to the arithmetically coded integer $x_c$, a signature $B_y$ specific to the arithmetically coded integer $y_c$ and a signature $B_z$ specific to the arithmetically coded integer in accordance with the relationship:

$$K_3 = B_z - B_x + B_y.$$

13. The method as claimed in claim 6, wherein the coded operation comprises a coded addition operation (CADD) in which the arithmetically coded integer $x_c$ and the arithmetically coded integer $y_c$ are added utilizing a second parameter $K_2$ to form an arithmetically coded integer $z_c$ in accordance with the relationship:

$$z_c = (x_c + y_c + K_2),$$

where the second parameter $K_2$ is calculated via a signature $B_x$ specific to the arithmetically coded integer $x_c$, a signature $B_y$ specific to the arithmetically coded integer $y_c$ and a signature $B_z$ specific to the arithmetically coded integer in accordance with the relationship:

$$K_2 = B_z - B_x - B_y.$$

14. The method as claimed in claim 6, wherein the coded operation comprises a coded subtraction operation (CSUB) in which a difference between the arithmetically coded integer $x_c$ and the arithmetically coded integer $y_c$ is calculated utilizing a third parameter $K_3$ in order to provide an arithmetically coded integer $z_c$ in accordance with the relationship:

$$z_c = (x_c - y_c + K_3),$$

where the third parameter $K_3$ is calculated via a signature $B_x$ specific to the arithmetically coded integer $x_c$, a signature $B_y$ specific to the arithmetically coded integer $y_c$ and a signature $B_z$ specific to the arithmetically coded integer in accordance with the relationship:

$$K_3 = B_z - B_x + B_y.$$

15. A non-transitory computer-readable medium encoded with a program instructions which, when executed by a processor of a programmable controller, causes data to be processed such that a functionally safe programmable controller is provided, the program instructions comprising:

program code for converting an uncoded real number x within the programmable controller into a logarithmic number system (LNS) coded integer $x_{LNS}$ via a predetermined conversion rule for the logarithmic number system (LNS) in accordance with the relationship:

$$x_{LNS} = \text{sgn}(x) \cdot 2^m + ld|x| \cdot 2^n,$$

where sgn(x) denotes a sign function of the uncoded real number x, $ld|x|$ denotes a binary logarithm of the uncoded real number x, m denotes a first exponent and n denotes a second exponent;

program code for coding the LNS-coded integer $x_{LNS}$ within the programmable controller into an arithmetically coded integer $x_c$ via arithmetic coding to provide the functionally safe programmable controller; and program code for controlling a machine within an industrial system via the functionally safe programmable controller.

16. An apparatus for processing data to provide a functionally safe programmable controller, comprising:

a conversion unit which is configured to convert an uncoded real number x into an logarithmic number system (LNS) coded integer $x_{LNS}$ via a predetermined conversion rule for a logarithmic number system (LNS) in accordance with the relationship:

$$x_{LNS} = \text{sgn}(x) \cdot 2^m + ld|x| \cdot 2^n,$$

where sgn(x) denotes a sign function of the uncoded real number x, $ld|x|$ denotes a binary logarithm of the uncoded real number x, m denotes a first exponent and n denotes a second exponent; and a coding unit which is configured to code the LNS-coded integer $x_{LNS}$ into an arithmetically coded integer $x_c$ via arithmetic coding;

wherein the functionally safe programmable controls a machine within an industrial system.

17. A functionally safe programmable controller having the apparatus as claimed in claim 16.

\* \* \* \* \*